US009551756B2

(12) United States Patent
Courtemanche et al.

(10) Patent No.: US 9,551,756 B2
(45) Date of Patent: Jan. 24, 2017

(54) METHOD FOR DETERMINING A MAXIMUM VOLTAGE VALUE OF A LOAD SIGNAL BY SAMPLING

(71) Applicant: RENAULT s.a.s., Boulogne-Billancourt (FR)

(72) Inventors: Florian Courtemanche, Versailles (FR); Yves Le-Vourch, Le Chesnay (FR); Thomas Peuchant, Paris (FR)

(73) Assignee: RENAULT s.a.s., Boulogne-Billancourt (FR)

( * ) Notice: Subject to any disclaimer, the term of this patent is extended or adjusted under 35 U.S.C. 154(b) by 94 days.

(21) Appl. No.: 14/401,372

(22) PCT Filed: May 13, 2013

(86) PCT No.: PCT/FR2013/051041
§ 371 (c)(1),
(2) Date: Nov. 14, 2014

(87) PCT Pub. No.: WO2013/171415
PCT Pub. Date: Nov. 21, 2013

(65) Prior Publication Data
US 2015/0130470 A1 May 14, 2015

(30) Foreign Application Priority Data

May 15, 2012 (FR) ...................... 12 54409

(51) Int. Cl.
*H02J 7/16* (2006.01)
*G01R 31/36* (2006.01)
(Continued)

(52) U.S. Cl.
CPC ......... *G01R 31/362* (2013.01); *G01R 19/2509* (2013.01); *G01R 23/02* (2013.01); *G01R 19/16542* (2013.01); *G01R 31/007* (2013.01)

(58) Field of Classification Search
CPC ..................... G01R 19/16542; G01R 19/2509; G01R 23/02; G01R 31/007; G01R 31/362; H02J 7/0093
(Continued)

(56) References Cited

U.S. PATENT DOCUMENTS 5,631,553 A     5/1997  Bose et al.
2004/0254750 A1* 12/2004 Macfarlene .......... G01R 22/065
                                                    702/61
2012/0326677 A1  12/2012 Tisserand et al.

FOREIGN PATENT DOCUMENTS

WO      2011 058259       5/2011

OTHER PUBLICATIONS

International Search Report Issued Jul. 22, 2013 in PCT/FR13/051041 Filed May 13, 2013.
(Continued)

*Primary Examiner* — Edward Tso
*Assistant Examiner* — Aaron Piggush
(74) *Attorney, Agent, or Firm* — Oblon, McClelland, Maier & Neustadt, L.L.P.

(57) ABSTRACT

A method for determining, by sampling at a given frequency, a maximum voltage value of a load signal of at least one motor vehicle battery cell, the load signal to be sampled being rectified and sinusoidal and having a frequency that is higher than the sampling frequency, the method including: determining a sampling frequency, a measurement time at the sampling frequency, and a related inaccuracy, measuring a load voltage with the predetermined sampling frequency and with the predetermined measurement time, and determining a maximum load voltage.

4 Claims, 1 Drawing Sheet

(51) Int. Cl.
*G01R 19/25* (2006.01)
*G01R 23/02* (2006.01)
*G01R 19/165* (2006.01)
*G01R 31/00* (2006.01)

(58) Field of Classification Search
USPC ............ 320/104, 141, 157; 324/426; 702/61
See application file for complete search history.

(56) References Cited

OTHER PUBLICATIONS

French Search Report Issued Mar. 4, 2013 in French Application No. 1254409 Filed May 15, 2012.

\* cited by examiner

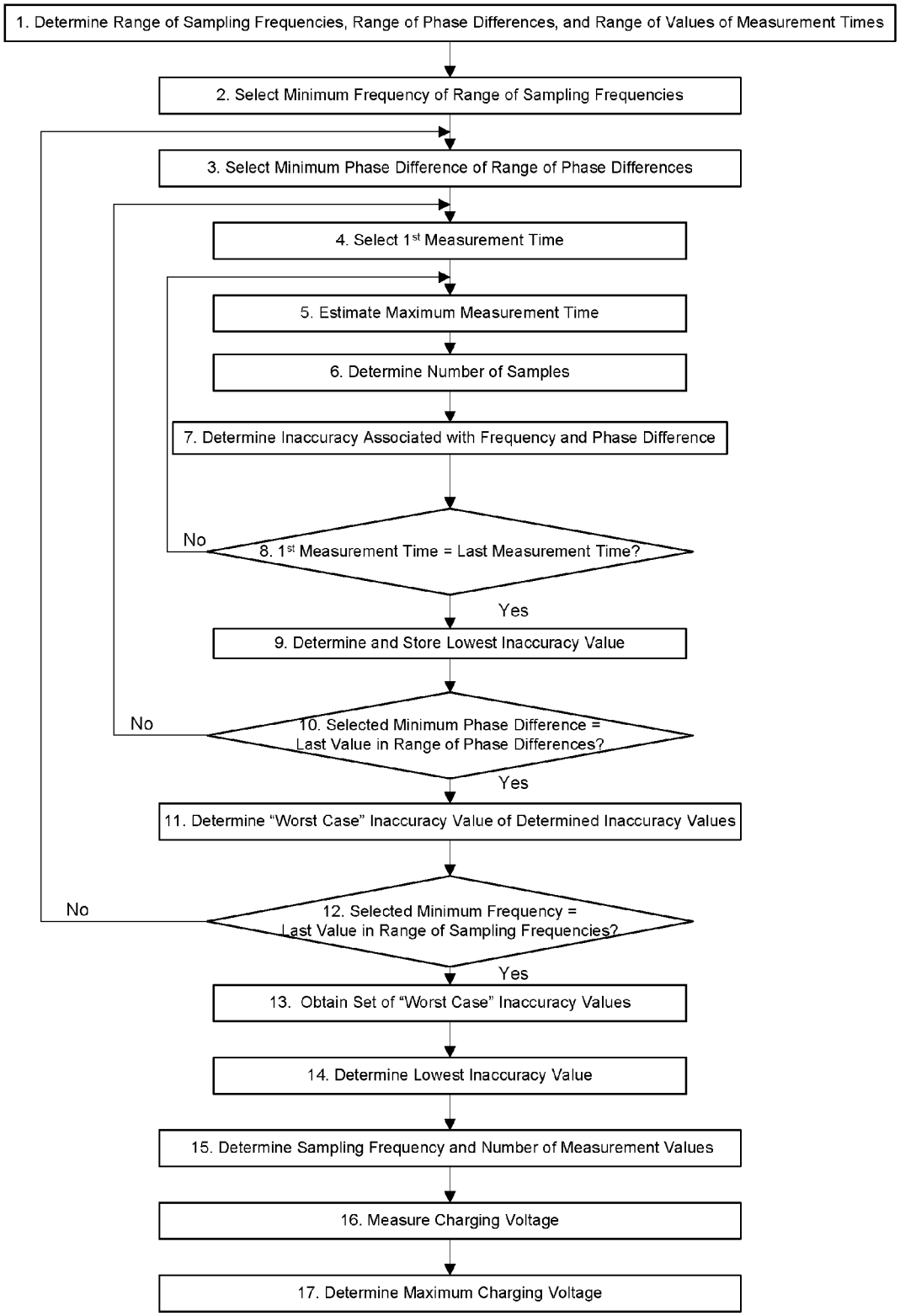

METHOD FOR DETERMINING A MAXIMUM VOLTAGE VALUE OF A LOAD SIGNAL BY SAMPLING

The technical field of the invention is the high-frequency measurement systems and more particularly the high-frequency measurement systems with under sampling.

In the high-frequency measurement systems that communicate in series, the data measurement and processing times have to optimized in order to be able to perform all the measurements with an acceptable accuracy. For this, the aim is to minimize the time allotted to each measurement.

In the field of batteries for motor vehicles, this problem arises in the detection of the maximum of a voltage of a cell during the charging of a cell battery by a single-phase charger.

During such charging, the voltage of a cell exhibits an almost continuous component that varies slowly and an alternating component whose appearance is directly linked to the charging current delivered by the charger. In single-phase charging this alternating component is a rectified sinusoidal signal. This part of the signal is called ripple. Detecting the maximum of the signal requires sufficient accurate sampling of the measurements.

The cell voltage is a parameter that is particularly important to monitor. In effect, when this voltage departs from the band of recommended values, abnormal electrochemical reactions occur, resulting in a degradation of the battery. These events may not occur immediately, but their process begins as soon as the cell voltage is outside the authorized voltage band. It is therefore necessary to act immediately when an upper or lower limit is reached. In such a case, the reaction can be to limit or stop the current to remain within the authorized voltage band. It is therefore necessary to be able to measure the maximum voltages of each cell of the battery.

For safety, a margin value is added to the measured value. The measured value taken into account is therefore overestimated. As seen above, a high cell voltage provokes a low charging power. Since an overestimation of the cell voltage is transparent for the determination of the charging power, it will result in a lowering of the charging power, which will involve an increase in the charging time.

The aim is then to minimize the value of the margin making it possible to ensure that the signal is kept between limits that make it possible to maximize the charging power, while maintaining the safety of each cell.

It is also necessary to optimize the time allotted to the voltage measurement.

There are two solutions that currently exist to address the constraints of a low measurement time and high measurement accuracy.

A first solution is to connect the measurement means in parallel so as to reduce the series communications. However, this entails multiplying hardware elements which generates a not-inconsiderable cost increase.

Another solution consists in being satisfied with a low sampling of the measurements, the average value of the signal then being the only accessible meaningful value. This can be done by increasing the safety margin around the upper or lower limits. By virtue of the charging power calculation explained above, the increase in the safety margin would lead to a permanent underestimation of the charging power. The charging time is then directly increased.

There thus remains a problem of determination of the measurement parameters that makes it possible to minimize the safety margin and increase the charging power while ensuring the safety of the motor vehicle battery cells.

The subject of the invention is a method for determining a maximum voltage value of a charging signal of at least one battery cell of a motor vehicle by sampling at a frequency, the charging signal to be sampled being rectified sinusoidal and having a frequency greater than the sampling frequency. The method comprises the following steps:

the sampling frequency, the measurement time at the sampling frequency and the associated inaccuracy are determined, the charging voltage is measured with the determined sampling frequency and with the determined measurement time, and the maximum of the charging voltage is determined.

The sampling frequency, the measurement time and the associated inaccuracy can be determined by performing the following steps:

a) for each sampling frequency of a range of sampling frequencies, the following steps b) to e) are carried out, b) for each phase difference value of a range of phase differences, the following steps c) to d) are carried out, c) for each measurement time of a range of measurement times, the inaccuracy associated with a measurement at the frequency exhibiting a phase difference as a function of the measurement time value is determined, d) the lowest inaccuracy for each phase difference out of all the inaccuracies relative to the phase difference considered is chosen, for the sampling frequency considered, e) the "worst case" inaccuracy is chosen for each sampling frequency out of the lowest inaccuracy values determined for each phase difference and for each sampling frequency considered, f) the lowest inaccuracy is determined out of the lowest inaccuracy values determined for each sampling frequency, g) the sampling frequency and the measurement time corresponding to the lowest inaccuracy are determined.

A range of sampling frequencies can be defined, comprising a minimum frequency, a maximum frequency, and a frequency step, a range of phase differences can be defined, comprising a minimum phase difference, a maximum phase difference and a phase difference step, and a range of measurement times can be defined, comprising a minimum measurement time, a maximum measurement time and a measurement time step.

The maximum measurement time can be defined as being derived from the product of the inverse of the sampling frequency by the integer part of the ratio of the frequency of the signal to be sampled to the sampling frequency.

Other aims, features and advantages will become apparent on reading the following description, given solely as a nonlimiting example and with reference to the single FIGURE attached, in which a method for determining a maximum voltage value is illustrated.

The alternating voltage employed to charge a battery is generally of sinusoidal form. In order to determine the minimum margin to be applied, it is necessary to have an accurate measurement of the maximum of the charging alternating voltage.

The measurement signal of this alternating voltage can be defined by the following equation:

$$s(t)=A\cdot|\sin(\omega\cdot t+\Phi)|+B \quad \text{(Eq. 1)}$$

in which:

A: amplitude of the measurement signal

B: average signal value

ω: pulsing of the signal ω=2.π.f
f: frequency in Hz
Φ: phase difference of the signal varying from 0 to π
t: time variable whose origin is taken at the instant of acquisition of the first sample.

The time signal s(t) is sampled with the pulsing $\omega_e$. The measurement points resulting from this sampling satisfy the following equation:

$$s_e(k) = A \cdot \left| \sin\left(2 \cdot \pi \cdot \frac{\omega}{\omega_e} \cdot k + \Phi\right) \right| \quad \text{(Eq. 2)}$$

in which k is an integer varying from 0 to n.

After n measurements at the pulsing $\omega_e$, a vector is obtained comprising the n+1 samplings $S_e(0)$ to $S_e(n)$ forming the following vector $S^*_\Phi$:

$$S^*_\Phi = [s_e^\Phi(0) s_e^\Phi(1) \ldots s_e^\Phi(k) \ldots s_e^\Phi(n)] \quad \text{(Eq. 3)}$$

During a measurement, only the vector $S^*_\Phi$ is accessible. There is consequently only an estimation of A through the maximum of $S^*_{101}$ available. In other words, it is possible to determine only the maximum out of the values available in the vector $S^*_\Phi$. It is therefore not possible to determine whether the signal has in reality passed through upper values which have not been measured. However, this situation can be minimized by increasing the number of points acquired. It then emerges that it is necessary to determine the trade-off between the number of points acquired and the available measurement time.

To sum up, to have a good accuracy of the estimation of A, a sufficient of number of samples n must be obtained, and for a given pulsing $\omega_e$.

The phase difference Φ depends on the instant at which the first sample $s_e^\Phi(0)$ is measured. It is a constraining parameter of the problem since it is impossible to know it without knowing the moment when the first sample is measured. This problem is circumvented by a calculation of the maximum of $S^*_\Phi$, called "worst case". This amounts to searching for the least good estimation of the maximum as a function of Φ. In these conditions, a measurement that is a function of the phase difference can only be equal to or better than this "worst case" estimation. It is thus possible to have the contribution of the phase difference, that cannot be controlled in a measurement, disappear.

Generally, a sample $s_e(k)$ exhibits a shape derived from the superposition of a continuous component and of sinusoidal component. To maximize $s_e(k)$, efforts are made to maximize its sinusoidal part.

The sinusoidal function $\phi \to |\sin(\phi)|$ is maximum for $$\varphi = \frac{\pi}{2} + p \cdot \pi$$

with p being an integer. The variable p is an integer varying between 0 and p_max. The p_max value is obtained by choosing the integer closest to the ratio of the frequency to be sampled by the sampling frequency. In practice, priority will be given to a value of p varying between 2 and p_max. In effect, a value of p equal to 1 does not make it possible to obtain a reliable measurement. The value of p can be likened to a measurement time beginning on each alternation of the sampling frequency and depending on the signal to be sampled. It will thus be understood that the value of p can at the maximum correspond only to the time between two samplings, a number of measurements of the signal to be sampled being within this time.

To maximize $s_e(k)$, efforts are therefore made to solve the following equation:

$$2\pi \cdot \frac{\omega}{\omega_e} \cdot n + \Phi = \frac{\pi}{2} + p \cdot \pi \quad \text{(Eq. 4)}$$

The solving of the equation 4 gives the following value of n.

$$n = \frac{\omega_e}{\omega} \cdot \left[ \left( \frac{1}{4} - \frac{\varphi}{2\pi} \right) + \frac{p}{2} \right] \quad \text{(Eq. 5)}$$

For a vector $S^*_\Phi$ of size n such that n satisfies the equation 5, the following will apply:

$$\max(S^*_\Phi) = A \quad \text{(Eq. 6)}$$

The difficulty in solving this equation lies in the fact that p and n are integers. Generally, this equation therefore does not accept any solution.

However, for any p integer, there is a real number x that satisfies the equation 5. The series X of points $x_p$ is defined such that:

$$x_p = \frac{\omega_e}{\omega} \cdot \left[ \left( \frac{1}{4} - \frac{\varphi}{2\pi} \right) + \frac{p}{2} \right] \quad \text{(Eq. 7)}$$

Moreover, this equation must be solved over a time interval of 0.1 second. Now, $$\varphi = \frac{\pi}{2} + p \cdot \pi = \omega \cdot t + \Phi \quad \text{(Eq. 8)}$$

$$\text{hence } p \leq \frac{1}{\pi} \cdot \left( 0.1 \cdot \omega - \frac{\pi}{2} \right) \quad \text{(Eq. 9)}$$

Once the series X of points $x_p$ has been evaluated, the point $x_p$ closest to an integer is chosen. The number n of samples to be measured is thus defined. For this, the following equation is solved:

$$n = \min |\text{round}(x_p) - x_p| \quad \text{(Eq. 10)}$$

in which round( ) is the function which gives the integer closest to a real number. In other words, for each value of p, a point $x_p$ is defined that is surrounded by two integers n and n+1. In our samples, there will be the values of the signal at n and n+1: $s_e^\Phi(n)$ and $s_e^\Phi(n+1)$. The point $x_p$ which will be closest to an integer n will give the best accuracy. This point is found using the equation 10.

n can be written in the form $n^* = x_p + \epsilon$, $\epsilon$ being comparable to an error of estimation of n by the integer $x_p$. It is then possible to estimate the error made on the maximum of s(t):

$$s_e^\Phi(n^*) = A \cdot \left| \sin\left(2 \cdot \pi \cdot \frac{\omega}{\omega_e} \cdot (x_p + \epsilon) + \Phi\right) \right| \quad \text{(Eq. 11)}$$

which can be developed as follows:

$$s_e^\Phi(n^*) = A \cdot \left| \sin\left(2 \cdot \pi \cdot \frac{\omega}{\omega_e} \cdot x_p + \Phi + 2 \cdot \pi \cdot \frac{\omega}{\omega_e} \cdot \epsilon\right) \right| \quad \text{(Eq. 12)}$$

now, by definition, $$2 \cdot \pi \cdot \frac{\omega}{\omega_e} \cdot x_p + \Phi = \frac{\pi}{2} + p\pi \text{ and,} \quad \text{(Eq. 13)}$$

$$\sin\left(\frac{\pi}{2} + p\pi + x\right) = \cos(x) \quad \text{(Eq. 14)}$$

The following is therefore obtained:

$$s_e^\Phi(n^*) = A \cdot \left|\cos\left(2 \cdot \pi \cdot \frac{\omega}{\omega_e} \cdot \varepsilon\right)\right| \quad \text{(Eq. 15)}$$

There is thus obtained $s_e^\Phi(n^*)$ whose cosine part corresponds to the inaccuracy on the maximum A of s(t).

As a reminder, the aim here is to find a sampling frequency $\omega_e/2\pi$, denoted fe, suitable for a measurement of the amplitude A of the measurement signal s(t), of sinusoidal form. The aim is also to have the uncertainty on A by evaluating $s_e^\Phi(n)$ for each value of $\Phi$ by applying the equation 15.

The method begins, in the step 1, with determination of a range of sampling frequencies comprising a minimum frequency, a maximum frequency, and a frequency step. The sampling frequency fe varies between 0 and the maximum frequency $fe_{max}$ of the sampling system. The sampling frequency step can be a fraction of the maximum frequency such that the maximum frequency corresponds to an integer number of frequency steps.

Similarly, a range of phase differences is also defined, comprising a minimum phase difference, a maximum phase difference and a phase difference step.

The phase difference varies from 0 to $\pi$. The step is preferably defined such that the maximum phase difference corresponds to an integer number of phase difference steps.

Finally, a range of values of p is defined, varying between 2 and $p_{max}$. The value of p corresponds also to the measurement time on each sampling. The step is generally defined as equal to unity.

During a step 2, the minimum frequency of the range of sampling frequencies is chosen.

During a step 3, the minimum phase difference is chosen from the range of phase differences.

During a step 4, the first value of p is chosen from the range of values of p.

During a step 5, the value of xp is estimated by the application of the equation 7.

During a step 6, the number n of samples is determined by the application of the equation 10. By knowing the sampling frequency fe, the measurement time is equal to n/fe.

During a step 7, the inaccuracy $s_e^\Phi(n^*)$ associated with a measurement at the frequency $\omega_e$ and with the phase difference $\Phi$ is determined as a function of the value of the parameter p by the application of the equation 15.

During a step 8, a determination is made as to whether the value p chosen in the step 4 is the last value of the range of p. If such is not the case, the steps 5 to 7 are executed again by incrementing the value of p in p value steps.

The values of the inaccuracy $s_e^\Phi(n^*)$ each associated with a different value of the parameter p are thus obtained. For each inaccuracy, the frequency $\omega_e$ and the phase difference $\Phi$ are set.

When the value p considered is the last, the method continues with the step 9, during which the lowest value out of the inaccuracy values obtained is determined. The lowest inaccuracy value is then stored in a mapping, together with the associated frequency fe, phase difference $\Phi$ and parameter p values.

The method continues with the step 10 during which a determination is made as to whether the phase difference value chosen in the third step is the last value of the range of phase differences.

If such is not the case, the steps 4 to 8 are executed again by incrementing the phase difference by the phase difference step.

A set of minimum values of the inaccuracy $s_e^\Phi(n^*)$ each associated with a phase difference $\Phi$ is thus obtained. For each inaccuracy, the frequency fe is set. Each minimum value of the inaccuracy being derived from the first loop, it is associated with a particular p value.

When the phase difference value considered is the last, the method continues with step 11, during which the "worst case" value is determined out of the inaccuracy values obtained. Such a method of choice consists in choosing the measurement for which the accuracy is the least good.

The least good value of the inaccuracy $s_e^\Phi(n^*)$ is thus obtained for a measurement at a frequency fe. Each less good value of the inaccuracy is moreover associated with a value of the parameter p. The method of choice employed has the effect of wiping out the influence of the phase difference. In effect, the accuracy will at worst be equal to the least good value and, at best, it will be much more accurate. Since the phase difference is difficult to control, this method of choice makes it possible to have an overestimated but still valid value of the measurement inaccuracy.

The method continues with the step 12 during which a determination is made as to whether the frequency chosen in the third step is the last value of the range of frequencies.

If such is not the case, the steps 4 to 11 are executed again by incrementing the frequency by the frequency step.

When the frequency value considered is the last, the method continues with the step 13.

There is then obtained a set of worst values of the inaccuracy $s_e^\Phi(n^*)$ each associated with one of the frequency fe. Through the preceding steps, each value of the inaccuracy is associated with a particular value of p.

The method, at step 14, can determine which is the lowest of the inaccuracy values. The sampling frequency fe and number of measurements p values associated with the chosen value are then determined at step 15. The sampling frequency fe and the number of measurements p are employed in order to configure the measurement means to measure the charging voltage at step 16 to determine a maximum charging voltage at step 17.

The invention claimed is:

1. A method for determining a maximum voltage value of a charging signal of at least one battery cell of a motor vehicle, by sampling at a sampling frequency, the charging signal to be sampled being a rectified sinusoidal charging signal and having a frequency greater than the sampling frequency, the method comprising:
   determining the sampling frequency, a measurement time at the sampling frequency, and an inaccuracy associated with the sampling frequency and the measurement time at the sampling frequency;
   measuring a charging voltage of the charging signal using the determined sampling frequency and using the determined measurement time; and
   determining a maximum of the charging voltage of the charging signal, the maximum of the charging voltage being the maximum voltage value of the charging signal, wherein said measuring the charging voltage of the charging signal using the determined sampling frequency undersamples the charging signal.

2. The method as claimed in claim 1, wherein the sampling frequency, the measurement time, and the associated inaccuracy are determined by performing:
- a) for each sampling frequency of a range of sampling frequencies, the following b) to e) are carried out,
- b) for each phase difference value of a range of phase differences, the following c) to d) are carried out,
- c) for each measurement time of a range of measurement times, determining inaccuracy associated with a measurement at the frequency exhibiting a phase difference as a function of the measurement time,
- d) choosing a lowest inaccuracy for each phase difference out of all the inaccuracies relative to the phase difference considered, for the sampling frequency considered,
- e) choosing a worst case inaccuracy for each sampling frequency out of the lowest inaccuracies determined for each phase difference and for each sampling frequency considered,
- f) determining the lowest inaccuracy out of the lowest inaccuracy values determined for each sampling frequency,
- g) determining the sampling frequency and the measurement time corresponding to the lowest inaccuracy.

3. The method as claimed in claim 1, wherein
a range of sampling frequencies is defined, comprising a minimum frequency, a maximum frequency, and a frequency step,
a range of phase differences is defined, comprising a minimum phase difference, a maximum phase difference, and a phase difference step, and
a range of measurement times is defined, comprising a minimum measurement time, a maximum measurement time, and a measurement time step.

4. The method as claimed in claim 3, wherein the maximum measurement time is defined as derived from the product of the inverse of the sampling frequency by the integer part of the ratio of the frequency of the signal to be sampled to the sampling frequency.

\* \* \* \* \*